(12) United States Patent
Ikeuchi

(10) Patent No.: US 7,279,778 B2
(45) Date of Patent: Oct. 9, 2007

(54) SEMICONDUCTOR PACKAGE HAVING A HIGH-SPEED SIGNAL INPUT/OUTPUT TERMINAL

(75) Inventor: Tadashi Ikeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 207 days.

(21) Appl. No.: 11/143,641

(22) Filed: Jun. 3, 2005

(65) Prior Publication Data

US 2005/0224929 A1    Oct. 13, 2005

Related U.S. Application Data

(63) Continuation of application No. PCT/JP03/06259, filed on May 20, 2003.

(51) Int. Cl.
*H01L 23/58* (2006.01)
*H01L 39/00* (2006.01)

(52) U.S. Cl. ............. 257/662; 257/643; 257/773; 257/693; 257/E23.034; 257/E23.055; 257/E23.065

(58) Field of Classification Search ............. 257/259, 257/643, 678–739, 747, 748, 662, 664, 773–798, 257/E23.034, E23.055, E23.065
See application file for complete search history.

(56) References Cited

U.S. PATENT DOCUMENTS 5,760,465 A * 6/1998 Alcoe et al. ............. 257/669

5,767,528 A    6/1998 Sumi et al.
6,882,042 B2 * 4/2005 Zhao et al. ............. 257/706

FOREIGN PATENT DOCUMENTS

| JP | 9-82877 | 3/1997 |
|---|---|---|
| JP | 9-181215 | 7/1997 |
| JP | 10-270600 | 10/1998 |
| JP | 2000-232197 | 8/2000 |
| JP | 2000-243870 | 9/2000 |
| JP | 2001-77236 | 3/2001 |
| JP | P2002-16167 | * 1/2002 |

* cited by examiner

*Primary Examiner*—Jasmine Clark
(74) *Attorney, Agent, or Firm*—Staas & Halsey LLP

(57) ABSTRACT

A semiconductor package including a flexible tape having a mounting portion and an extended portion, a plurality of arrayed connection electrodes provided on the mounting portion of the flexible tape, and a semiconductor chip mounted on the mounting portion of the flexible tape. The semiconductor package further includes a high-speed signal electrode formed at the front end of the extended portion of the flexible tape, and a transmission line provided on the flexible tape for connecting the semiconductor chip and the high-speed signal electrode. A stiffener is mounted on the mounting portion of the flexible tape.

16 Claims, 6 Drawing Sheets

SEMICONDUCTOR PACKAGE HAVING A HIGH-SPEED SIGNAL INPUT/OUTPUT TERMINAL

This is a continuation of PCT International Application NO. PCT/JP03/006259, filed May 20, 2003, which was not published in English.

BACKGROUND OF THE INVENTION

1. Field of the Invention

The present invention relates to a semiconductor package having a high-speed signal input/output terminal.

2. Description of the Related Art

Known as a conventional semiconductor package having a high-speed signal input/output terminal is a semiconductor package capable of transmitting a high-speed signal without degradation by mounting a connector on a part of the package. However, in such a semiconductor package having a connector mounted on a part of the package, a structure for mounting the connector is complicated to cause a cost increase. Further, it is difficult to make the package compact because of the necessity of mounting the connector.

Japanese Patent Laid-open No. 2000-232197 discloses a semiconductor package having a configuration such that a high-speed signal electrode is surrounded by a ground electrode. Owing to this configuration that the high-speed signal electrode is surrounded by the ground electrode, the inductance at a connecting portion for a high-speed signal can be reduced to thereby reduce the degradation of the high-speed signal. In the semiconductor package described in this publication, the inductance at the high-speed signal connecting portion can be reduced. However, it cannot be completely nullified, and signal degradation is caused in transmitting a high-frequency signal having a frequency of 20 GHz or more. The inductance at the connecting portion can be reduced also by reducing the ball diameter of a ball grid array (BGA) composed of solder balls. In this case, however, mechanical reliability is lowered in mounting the semiconductor package on a printed wiring board.

SUMMARY OF THE INVENTION

It is therefore an object of the present invention to provide a high-frequency semiconductor package which can achieve a reduced degradation for a high-frequency signal having a frequency of 20 GHz or more and can also achieve a high reliability at a low cost.

In accordance with an aspect of the present invention, there is provided a semiconductor package including a flexible tape having a mounting portion and an extended portion; a plurality of arrayed connection electrodes provided on the mounting portion of the flexible tape; a semiconductor chip mounted on the mounting portion of the flexible tape; a high-speed signal electrode formed at the front end of the extended portion of the flexible tape; and a transmission line provided on the flexible tape for connecting the semiconductor chip and the high-speed signal electrode.

Preferably, the semiconductor package further includes a stiffener mounted on the mounting portion of the flexible tape. The stiffener is formed of ceramic or resin. Preferably, the semiconductor package further includes a radiation fin mounted on the stiffener.

Preferably, the semiconductor package further includes a pair of ground electrodes formed at the front end of the extended portion of the flexible tape so that the high-speed signal electrode is interposed between the ground electrodes. The flexible tape has a pair of first ground patterns on the opposite sides of the transmission line, and the ground electrodes are respectively connected to the first ground patterns. Preferably, the flexible tape has a second ground pattern on the surface opposite to the surface where the transmission line is formed, at a portion corresponding to at least the transmission line and the first ground patterns.

The semiconductor chip is mounted on the mounting portion of the flexible tape by flip chip bonding. Alternatively, the semiconductor chip is connected to the mounting portion of the flexible tape by TAB.

The arrayed connection electrodes formed on the flexible tape are connected through a ball grid array to a printed wiring board. Preferably, the printed wiring board has a wiring pattern impedance-matched to the transmission line and also has a pair of ground patterns, wherein the high-speed signal electrode of the flexible tape is connected to the wiring pattern of the printed wiring board, and the ground electrodes of the flexible tape are respectively connected to the ground patterns of the printed wiring board.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
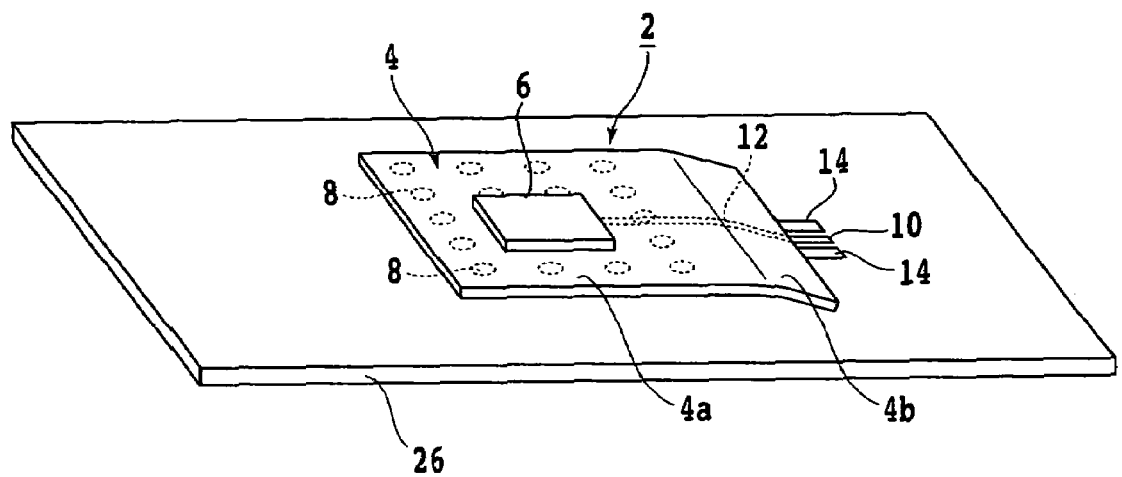
FIG. 1 is a perspective view of a semiconductor package according to the first preferred embodiment of the present invention mounted on a printed wiring board.

Referring to FIG. 1, there is shown a perspective view of a semiconductor package 2 according to the first preferred embodiment of the present invention mounted on a printed wiring board 26. Reference numeral 4 denotes a flexible tape formed of polyimide, for example. The flexible tape 4 has a thickness of about 50 µm. The flexible tape 4 has a mounting portion 4a and an extended portion 4b. A semiconductor chip 6 is mounted on the upper surface of the mounting portion 4a of the flexible tape 4, and a plurality of arrayed connection electrodes 8 are formed on the lower surface of the mounting portion 4a. A high-speed signal electrode 10 and a pair of ground electrodes 14 are formed at the front end of the extended portion 4b of the flexible tape 4 in such a manner that the high-speed signal electrode 10 is interposed between the ground electrodes 14 in the same plane. The semiconductor chip 6 and the high-speed signal electrode 10 are connected to each other by a transmission line 12 formed on the lower surface of the flexible tape 4.

Figure 3:
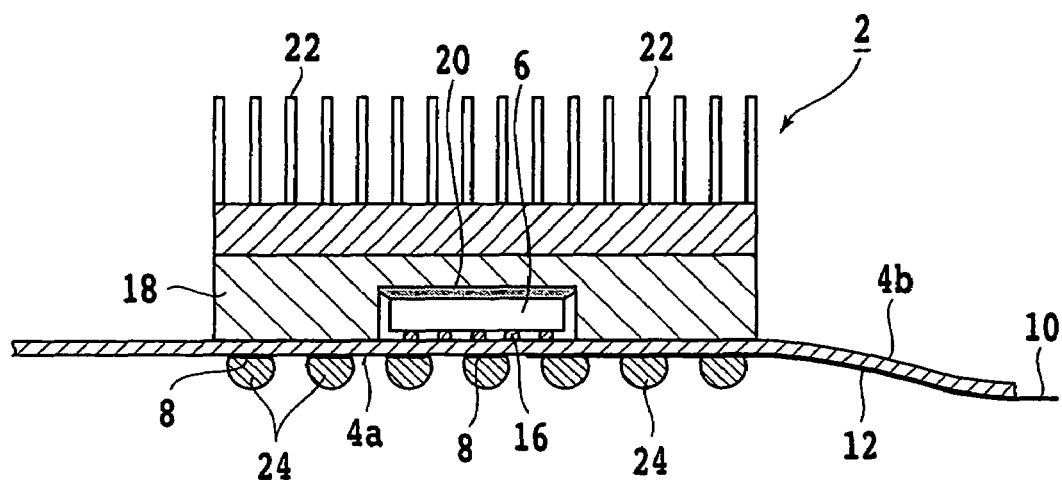
FIG. 3 is a sectional view of the semiconductor package according to the first preferred embodiment in the condition that a stiffener and a radiation fin are mounted.

FIG. 3 shows a sectional view of the semiconductor package 2 according to the first preferred embodiment in the condition where a stiffener 18 and a radiation fin 22 are mounted. The semiconductor chip 6 is mounted on the upper surface of the mounting portion 4a of the flexible tape 4 by flip chip bonding using a plurality of solder balls 16 with a reduced inductance at a connecting portion. The stiffener 18 is mounted on the upper surface of the mounting portion 4a of the flexible tape 4 and fixed thereto by an adhesive. The stiffener 18 is formed of ceramic having good radiation characteristics. Reference numeral 20 denotes an adhesive for fixing the stiffener 18 to the semiconductor chip 6. The radiation fin 22 is mounted on the stiffener 18 and fixed thereto by an adhesive. The radiation fin 22 is formed of aluminum, for example. A ball grid array (BGA) 24 composed of a plurality of solder balls is provided on the lower surface of the mounting portion 4a of the flexible tape 4 in such a manner that the solder balls respectively correspond to the arrayed connection electrodes 8.

Figure 4:
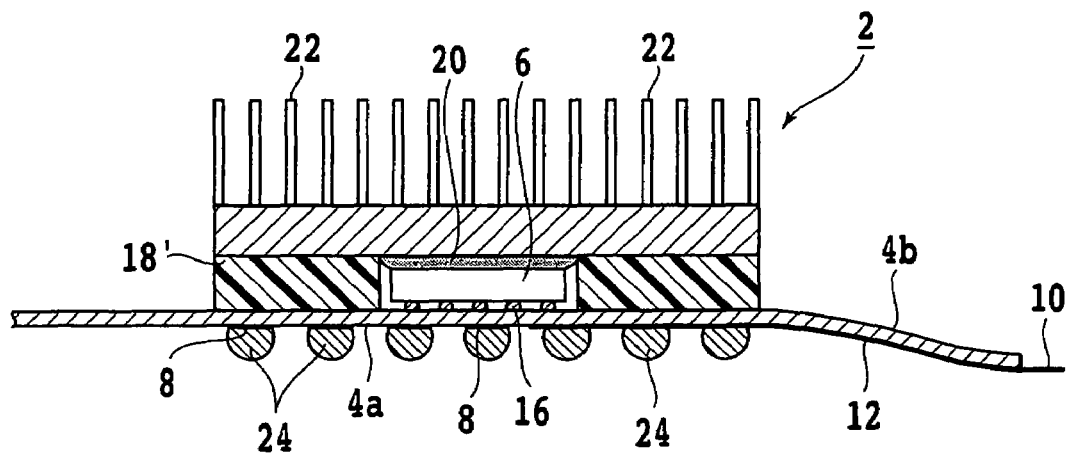
FIG. 4 is a sectional view similar to FIG. 3, showing a modification of the first preferred embodiment wherein the radiation fin is in direct contact with a semiconductor chip.

FIG. 4 shows a modification of the first preferred embodiment, in which a stiffener 18' is used in place of the stiffener 18 shown in FIG. 3. In this modification, the radiation fin 22 is in direct contact with the semiconductor chip 6. Accordingly, heat generated from the semiconductor chip 6 is radiated mainly through the radiation fin 22, and the stiffener 18' may therefore be formed of resin inferior in radiation characteristics to ceramic. The semiconductor chip 6 in the semiconductor package 2 is connected through the ball grid array 24 to a wiring pattern formed on the printed wiring board 26, and is also connected through the transmission line 12 and the high-speed signal electrode 10 to another wiring pattern formed on the printed wiring board 26.

According to this preferred embodiment, the transfer of a high-speed signal to the printed wiring board 26 is made through the transmission line 12 provided on the extended portion 4b of the flexible tape 4 as a base member of the semiconductor package 2, thereby realizing the transfer of a high-speed signal with a reduced degradation. The extended portion 4b is in separation from the printed wiring board 26, so that stress due to temperature changes or the like can be absorbed by the deformation of the extended portion 4b. While the extended portion 4b is formed on one side of the semiconductor package 2 in this preferred embodiment, a plurality of extended portions may be formed on a plurality of sides of the semiconductor package 2 and a high-speed signal transmission line may be formed on each extended portion.

Figure 2:
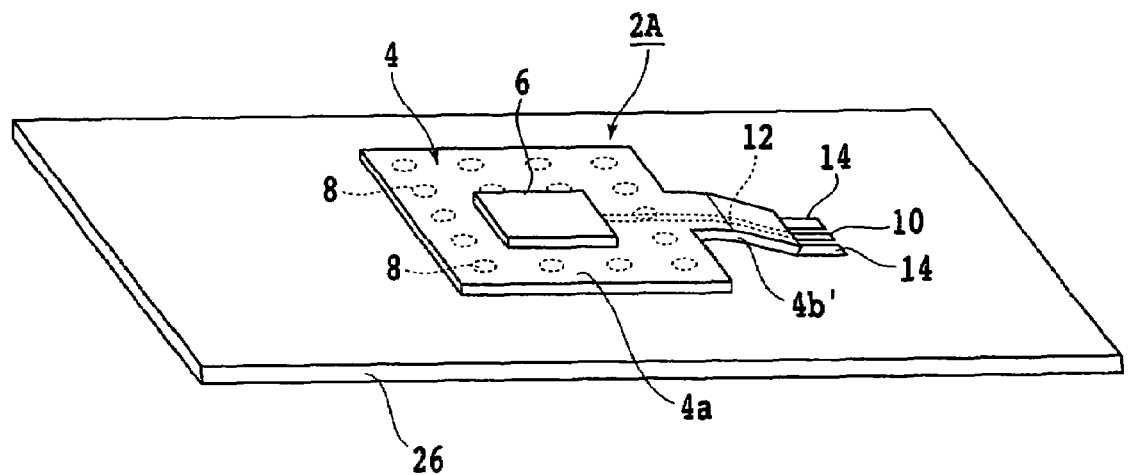
FIG. 2 is a perspective view of a semiconductor package according to the second preferred embodiment of the present invention mounted on a printed wiring board.

FIG. 2 shows a perspective view of a semiconductor package 2A according to the second preferred embodiment of the present invention mounted on the printed wiring board 26. In this preferred embodiment, the flexible tape 4 has an extended portion 4b' narrower than the mounting portion 4a. By making the width of the extended portion 4b' smaller than the length of one side of the semiconductor package 2A in this manner, the tolerance to bending of the tape 4 can be widened to thereby relieve mechanical stress in mounting the semiconductor package 2A on the printed wiring board 26 and to thereby realize the mounting with a high reliability against mechanical shock.

Figure 5:
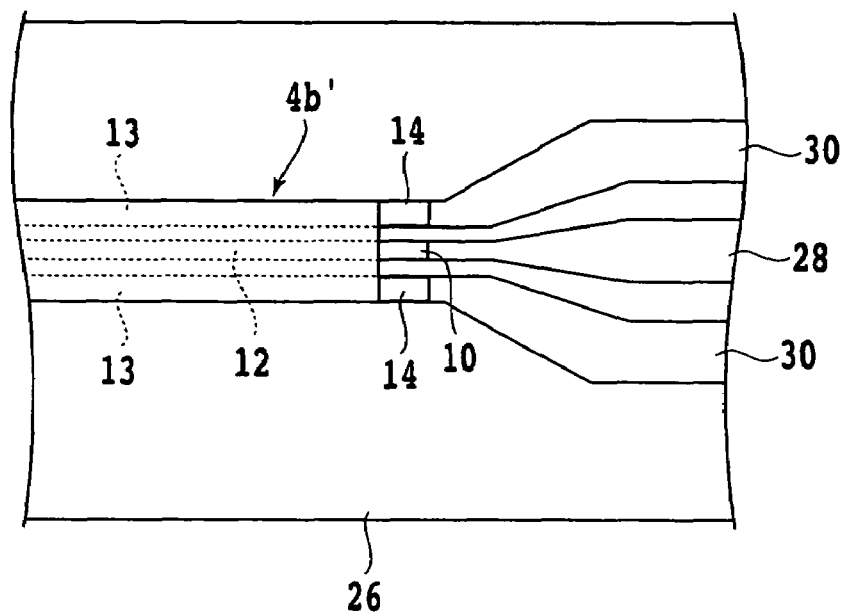
FIG. 5 is a plane view of an essential part of the second preferred embodiment, showing the connection between a high-speed signal electrode of a flexible tape and a wiring pattern of a printed wiring board and the connection between ground electrodes of the flexible tape and ground patterns of the printed wiring board.

FIG. 5 shows the connection of the extended portion 4b' and the printed wiring board 26 shown in FIG. 2. A pair of ground patterns 13 are formed on the lower surface of the extended portion 4b' in such a manner that the transmission line 12 is interposed between the ground patterns 13 in the same plane. The ground patterns 13 are respectively connected to the ground electrodes 14. The high-speed signal electrode 10 is connected to a wiring pattern 28 formed on the printed wiring board 26, in which the wiring pattern 28 is impedance-matched to the transmission line 12. The ground electrodes 14 are respectively connected to a pair of ground patterns 30 formed on the printed wiring board 26. In this manner, the connection of the extended portion 4b' and the printed wiring board 26 is realized by a coplanar line connection using the ground electrodes 14 on the opposite sides of the high-speed signal electrode 10. Accordingly, the discontinuity of grounding as a cause of the degradation of a high-speed signal can be prevented to thereby suppress the degradation of a high-speed signal. While a single signal line is shown in FIG. 5, a similar coplanar line connection may be adopted for a plurality of signal lines. Also in the first preferred embodiment shown in FIG. 1, a similar coplanar line connection is adopted for the connection between the extended portion 4b of the flexible tape 4 and the printed wiring board 26.

Figure 6:
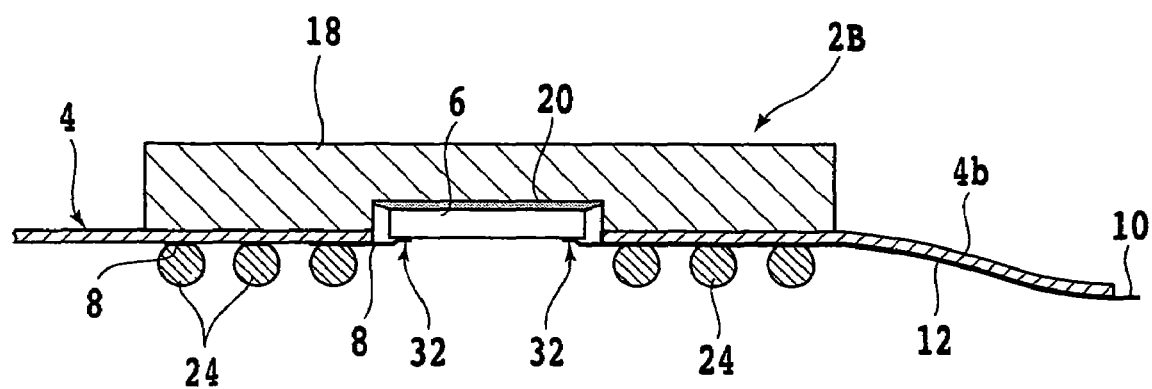
FIG. 6 is a sectional view of a semiconductor package according to the third preferred embodiment of the present invention, wherein a semiconductor chip is connected to a flexible tape by TAB.

FIG. 6 shows a sectional view of a semiconductor package 2B according to the third preferred embodiment of the present invention. In this preferred embodiment, the semiconductor chip 6 and a wiring pattern formed on the flexible tape 4 are connected to each other by tape automated bonding (TAB) 32 such that the wiring pattern on the tape 4 is directly connected to the semiconductor chip 6. With this arrangement, the inductance at a connecting portion between the semiconductor chip 6 and the tape 4 can be minimized and the connection with a reduced degradation can be realized at a low cost.

Figure 7:
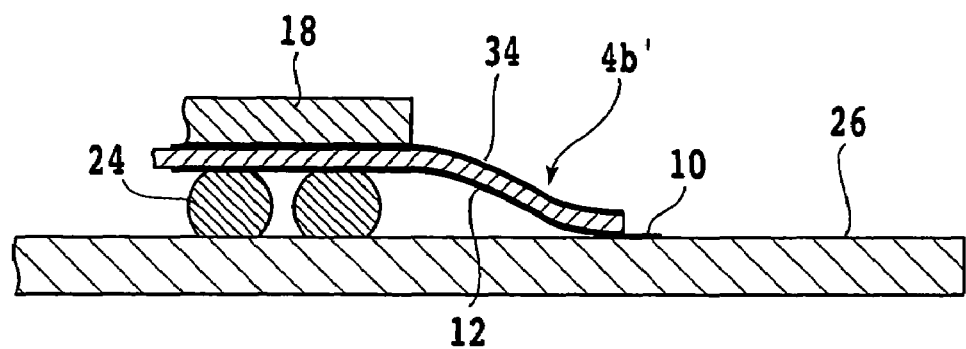
FIG. 7 is a sectional view of an essential part of another preferred embodiment, wherein a ground pattern is formed on the upper surface of a flexible tape opposite to the surface where a high-speed signal electrode is formed.
Figure 8:
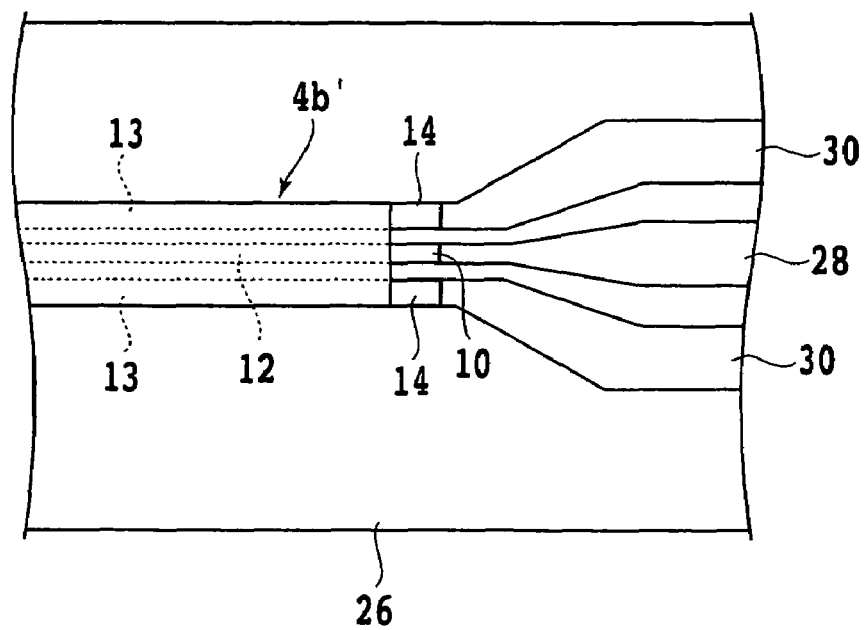
FIG. 8 is a plane view similar to FIG. 5, showing the connection between the high-speed signal electrode and the wiring pattern and the connection between the ground electrodes and the ground patterns in the preferred embodiment shown in FIG. 7.

Referring to FIG. 7, there is shown another preferred embodiment wherein the extended portion 4b' of the flexible tape 4 has a ground pattern 34 on the surface opposite to the surface where the transmission line 12 is formed. As shown in FIG. 8, a pair of ground patterns 13 are formed on the lower surface of the extended portion 4b' of the flexible tape 4 in such a manner that the transmission line 12 is interposed between the ground patterns 13 in the same plane. These ground patterns 13 are respectively connected through the ground electrodes 14 to the ground patterns 30 on the printed wiring board 26. The ground pattern 34 formed on the upper surface of the extended portion 4b' of the flexible tape 4 opposite to the transmission line 12 is located so as to correspond to at least the transmission line 12 and the ground patterns 13. In this manner, a grounded coplanar line is adopted as a portion of the transmission line 12 formed on the extended portion 4b', and this portion of the transmission line 12 and the ground patterns 13 are respectively connected through the high-speed signal electrode 10 and the ground electrodes 14 to the wiring pattern 28 and the ground patterns 30 on the printed wiring board 26, thereby realizing the connection for a high-speed signal with a reduced degradation.

Figure 9:
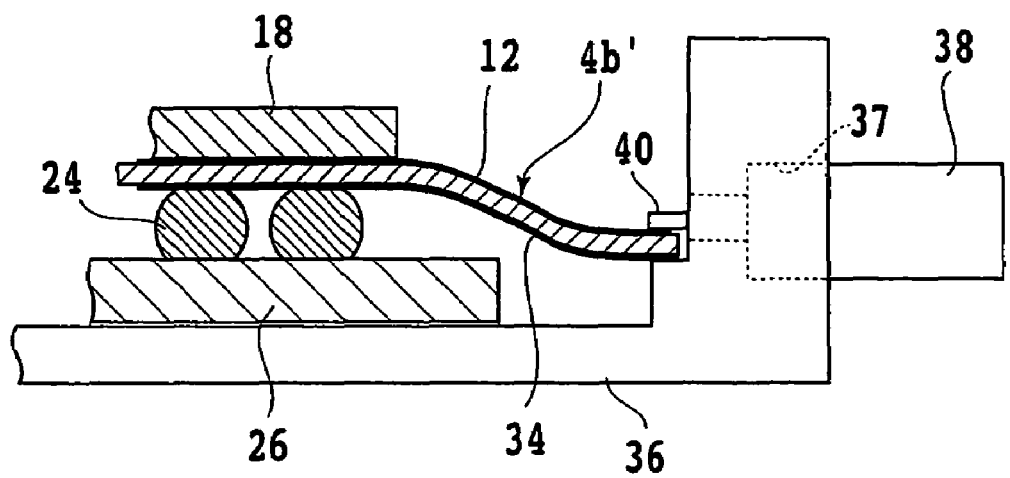
FIG. 9 is a partially sectional elevation of a preferred embodiment using a connector connected to an extended portion of the flexible tape.

Referring to FIG. 9, a printed wiring board 26 is mounted on a metal block 36. The metal block 36 is formed with a through hole 37, and a connector 38 having a terminal 40 is inserted in the through hole 37 in such a manner that the terminal 40 projects from the through hole 37. The terminal 40 of the connector 38 is connected to the transmission line 12. According to this preferred embodiment, the reliability against mechanical shock can be improved, and the external connection for a high-speed signal with a reduced degradation can be realized.

Figure 10:
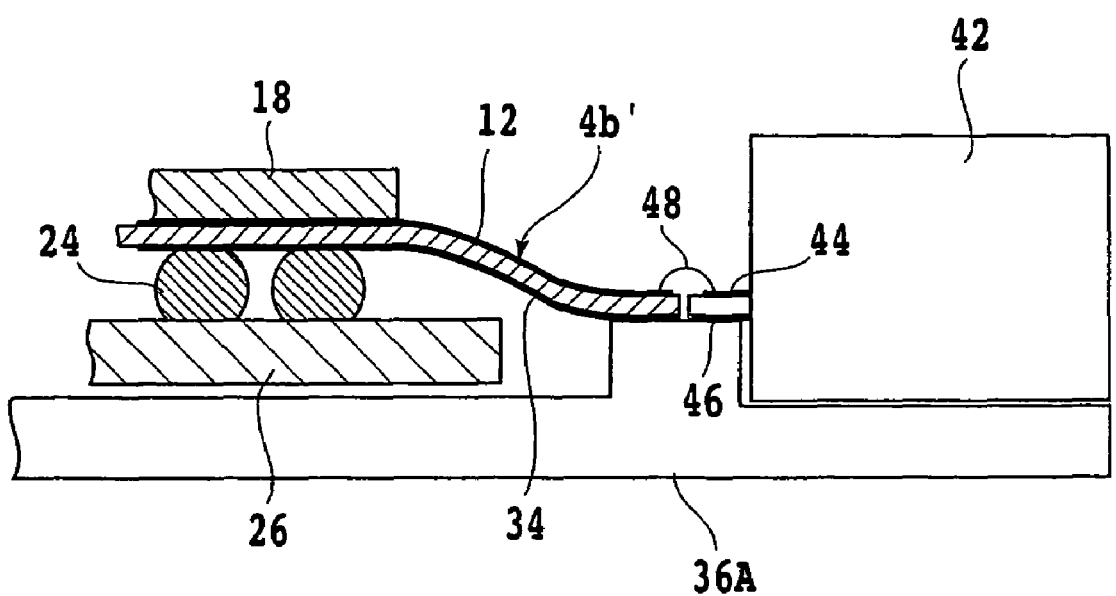
FIG. 10 is a partially sectional elevation of another preferred embodiment using a high-frequency device connected to the extended portion of the flexible tape.

Referring to FIG. 10, a printed wiring board 26 and a high-frequency device 42 having a signal electrode 44 and a ground electrode 46 are mounted on a metal block 36A. The transmission line 12 on the extended portion 4b' is connected through a bonding wire 48 to the signal electrode 44 of the high-frequency device 42. The ground pattern 34 on the extended portion 4b' is connected through the metal block 36A to the ground electrode 46 of the high-frequency device 42. The high-frequency device 42 may be replaced by an optical device. In this manner, the semiconductor package is directly connected to the high-frequency device 42 or the optical device, so that the reliability against mechanical shock can be improved and the connection for a high-speed signal with a reduced degradation can be realized.

Figure 11:
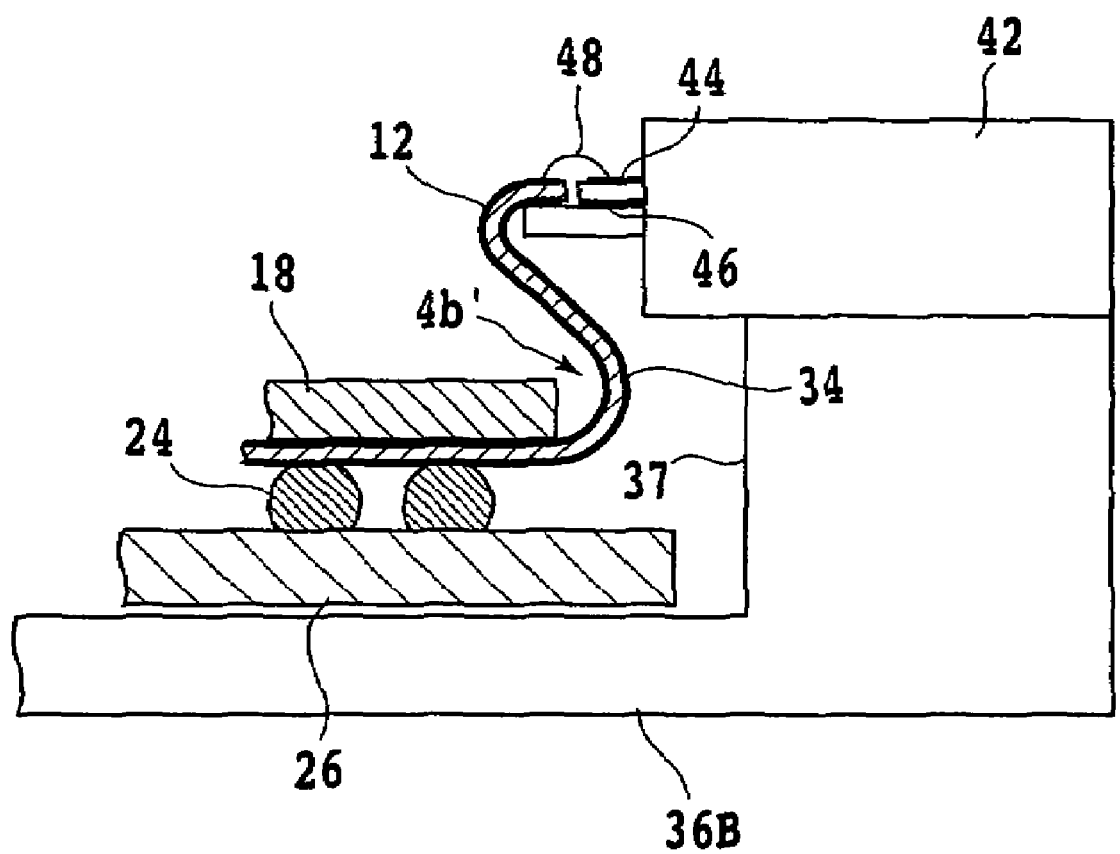
FIG. 11 is a partially sectional elevation of another preferred embodiment, wherein the high-frequency device connected to the extended portion of the flexible tape is located at a level higher than that of a printed wiring board on which a semiconductor chip is mounted.

Referring to FIG. 11, a metal block 36B having a rising portion 37 is used. A high-frequency device 42 similar to that shown in FIG. 10 is mounted on the rising portion 37 of the metal block 36B at a level higher than that of the printed wiring board 26. Since the extended portion 4b' is formed from a flexible tape, the connection between the semiconductor package and the high-frequency device 42 or the optical device at different levels can be easily achieved, and a mounting area can be reduced.

In the present invention, a high-speed signal is transferred through the transmission line 12 and the high-speed signal electrode 10 to the wiring pattern on the printed wiring board 26, and a low-speed signal is transferred through the ball grid array 24 to the wiring pattern on the printed wiring board 26. With this configuration, a high-frequency signal can be transferred through a transmission line to a wiring pattern on a printed wiring board without impedance discontinuity, thereby minimizing the degradation of a high-speed signal.

The transfer of any signal other than the high-speed signal is made by using the arrayed connection electrodes 8 for a ball grid array facilitating the mounting of a semiconductor package on a printed wiring board, thereby allowing a reduction in cost of the semiconductor package. Further, a flexible tape is used as a base member for the semiconductor package, thereby relieving mechanical stress on the connecting portions to the high-speed electrode and the arrayed electrodes and ensuring mechanical reliability in mounting.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor package comprising:
   a flexible tape having a mounting portion and an extended portion;
   a plurality of arrayed connection electrodes provided on said mounting portion of said flexible tape;
   a semiconductor chip mounted on said mounting portion of said flexible tape;
   a high-speed signal electrode formed at the front end of said extended portion of said flexible tape; and
   a transmission line provided on said flexible tape for connecting said semiconductor chip and said high-speed signal electrode,
   wherein a surface of said mounting portion of said flexible tape connects to said semiconductor, and a side portion of said mounting portion of said flexible tape connects to a side portion of said extended portion of said flexible tape.

2. The semiconductor package according to claim 1, further comprising a stiffener mounted on said mounting portion of said flexible tape.

3. The semiconductor package according to claim 2, wherein said stiffener is formed of ceramic, and bonded to said mounting portion of said flexible tape.

4. The semiconductor package according to claim 2, wherein said stiffener is formed of resin, and bonded to said mounting portion of said flexible tape.

5. A semiconductor package comprising:
   a flexible tape having a mounting portion and an extended portion;
   a plurality of arrayed connection electrodes provided on said mounting portion of said flexible tape;
   a semiconductor chip mounted on said mounting portion of said flexible tape;
   a high-speed signal electrode formed at the front end of said extended portion of said flexible tape; and
   a transmission line provided on said flexible tape for connecting said semiconductor chip and said high-speed signal electrode,
   wherein said extended portion has a width smaller than that of said mounting portion.

6. A semiconductor package comprising:
   a flexible tape having a mounting portion and an extended portion;
   a plurality of arrayed connection electrodes provided on said mounting portion of said flexible tape;
   a semiconductor chip mounted on said mounting portion of said flexible tape;
   a high-speed signal electrode formed at the front end of said extended portion of said flexible tape;
   a transmission line provided on said flexible tape for connecting said semiconductor chip and said high-speed signal electrode;
   a stiffener mounted on said mounting portion of said flexible tape; and
   a pair of ground electrodes formed at the front end of said extended portion of said flexible tape so that said high-speed signal electrode is interposed between said ground electrodes.

7. The semiconductor package according to claim 6, wherein said flexible tape has a pair of first ground patterns on the opposite sides of said transmission line, and said ground electrodes are respectively connected to said first ground patterns.

8. The semiconductor package according to claim 7, wherein said flexible tape has a second ground pattern on the surface opposite to the surface where said transmission line is formed, at a portion corresponding to at least said transmission line and said first ground patterns.

9. The semiconductor package according to claim 6, further comprising a printed wiring board on which said flexible tape is mounted; said arrayed connection electrodes being connected through a ball grid array to said printed wiring board.

10. The semiconductor package according to claim 9, wherein said printed wiring board has a wiring pattern impedance-matched to said transmission line and a pair of ground patterns;
   said high-speed signal electrode of said flexible tape being connected to said wiring pattern of said printed wiring board;
   said ground electrodes of said flexible tape being respectively connected to said ground patterns of said printed wiring board.

11. The semiconductor package according to claim 9, further comprising a connector connected to said high-speed signal electrode.

12. The semiconductor package according to claim 9, further comprising a high-frequency component connected to said high-speed signal electrode.

13. The semiconductor package according to claim 12, further comprising a metal block on which said printed wiring board and said high-frequency component are mounted; said metal block having a rising portion for mounting said high-frequency component at a level higher than that of said printed wiring board.

14. A semiconductor package comprising:
   a flexible tape having a mounting portion and an extended portion;
   a plurality of arrayed connection electrodes provided on said mounting portion of said flexible tape;
   a semiconductor chip mounted on said mounting portion of said flexible tape;
   a high-speed signal electrode formed at the front end of said extended portion of said flexible tape;
   a transmission line provided on said flexible tape for connecting said semiconductor chip and said high-speed signal electrode; and
   a stiffener mounted on said mounting portion of said flexible tape,
   wherein said semiconductor chip is mounted on said mounting portion of said flexible tape by flip chip bonding.

15. A semiconductor package comprising:
   a flexible tape having a mounting portion and an extended portion;
   a plurality of arrayed connection electrodes provided on said mounting portion of said flexible tape;
   a semiconductor chip mounted on said mounting portion of said flexible tape;
   a high-speed signal electrode formed at the front end of said extended portion of said flexible tape;
   a transmission line provided on said flexible tape for connecting said semiconductor chip and said high-speed signal electrode; and
   a stiffener mounted on said mounting portion of said flexible tape,
   wherein said semiconductor chip is connected to said mounting portion of said flexible tape by TAB.

16. A semiconductor package comprising:
   a flexible tape having a mounting portion and an extended portion;
   a plurality of arrayed connection electrodes provided on said mounting portion of said flexible tape;
   a semiconductor chip mounted on said mounting portion of said flexible tape;
   a high-speed signal electrode formed at the front end of said extended portion of said flexible tape;
   a transmission line provided on said flexible tape for connecting said semiconductor chip and said high-speed signal electrode;
   a stiffener mounted on said mounting portion of said flexible tape; and
   a radiation fin mounted on said stiffener.

* * * * *